(12) United States Patent
Kim et al.

(10) Patent No.: US 7,629,532 B2
(45) Date of Patent: Dec. 8, 2009

(54) SOLAR CELL HAVING ACTIVE REGION WITH NANOSTRUCTURES HAVING ENERGY WELLS

(75) Inventors: James C. Kim, San Jose, CA (US); Sungsoo Yi, Sunnyvale, CA (US)

(73) Assignee: Sundiode, Inc., Sunnyvale, CA (US)

( * ) Notice: Subject to any disclaimer, the term of this patent is extended or adjusted under 35 U.S.C. 154(b) by 418 days.

(21) Appl. No.: 11/648,059

(22) Filed: Dec. 29, 2006

(65) Prior Publication Data

US 2008/0156366 A1 Jul. 3, 2008

(51) Int. Cl.
*H01L 31/00* (2006.01)
*H01L 21/00* (2006.01)

(52) U.S. Cl. .................. 136/255; 136/249; 136/252; 257/14; 257/98; 438/72

(58) Field of Classification Search ................ 136/249, 136/252, 255; 257/98, 14; 438/72
See application file for complete search history.

(56) References Cited

U.S. PATENT DOCUMENTS

| | | | |
|---|---|---|---|
| 6,054,726 A * | 4/2000 | Ogihara et al. | 257/98 |
| 6,437,233 B1 * | 8/2002 | Tran et al. | 136/249 |
| 6,882,051 B2 | 4/2005 | Majumdar et al. | |
| 7,087,832 B2 | 8/2006 | Scher et al. | |
| 7,129,154 B2 | 10/2006 | Yi | |
| 7,306,963 B2 | 12/2007 | Linden | |
| 2005/0051205 A1 * | 3/2005 | Mook, Jr. | 136/255 |
| 2006/0057360 A1 | 3/2006 | Samuelson et al. | |
| 2006/0207647 A1 | 9/2006 | Tsakalakos et al. | |
| 2006/0226416 A1 * | 10/2006 | Lee et al. | 257/14 |

OTHER PUBLICATIONS

International Search Report and Written Opinion dated Nov. 17, 2008 in PCT Application No. PCT/US2007/089074.
K.W.J. Barnham et al., "A new approach to high-efficiency multi-band-gap solar cells," Journal of Appl. Physics 67(7), Apr. 1, 1990, pp. 3490-3493.
Keith Barnham et al. "Voltage enhancement in quantum well solar cells," Journal of App. Physics 80(2), Jul. 15, 1996, pp. 1201-1206.
Martin A. Green, "Potential for low dimensional structures in photovoltaics," Photovoltaics Special Research Centre, Univ. of New South Wales, Australia, Material Science and Engineering B74 (2000) pp. 118-124.

(Continued)

*Primary Examiner*—Roy King
*Assistant Examiner*—Rebecca Lee
(74) *Attorney, Agent, or Firm*—Vierra Magen Marcus & DeNiro LLP

(57) ABSTRACT

A method and apparatus for solar cell having graded energy wells is provided. The active region of the solar cell comprises nanostructures. The nanostructures are formed from a material that comprises a III-V compound semiconductor and an element that alters the band gap of the III-V compound semiconductor. For example, the III-V compound semiconductor could be gallium nitride (GaN). As an example, the "band gap altering element" could be indium (In). The concentration of the indium in the active region is non-uniform such that the active region has a number of energy wells, separated by barriers. The energy wells may be "graded", by which it is meant that the energy wells have a different band gap from one another, generally increasing or decreasing from one well to another monotonically.

33 Claims, 7 Drawing Sheets

OTHER PUBLICATIONS

International Preliminary Report on Patentability and Written Opinion of the International Searching Authority dated Jun. 30, 2009 in PCT Application No. PCT/US2007/089074.

W. Walukiewicz, "Full Solar Spectrum Photovoltaic Materials Identified", Berkeley Lab, Materials Science Division, 2002, http://www.lbl.gov/msd/Pls/Walukiewicz/02/02_8_Full_Solar_Spectrum.html.

Brenton Burnett, "The Basic Physics and Design of III-V Multijunction Solar Cells", NREL's III-V research group, Summber 2002, pp. 1-18.

Akihiko Kikuchi et al., "InGaN/GaN Multiple Quantum Disk Nanocolumn Light-Emitting Diodes Grown on (111) Si Substrate", Japanese Journal of Applied Physics, Nov. 5, 2004, pp. L1524-L1526, vol. 43, No. 12A.

Akihiko Kikuchi et al., "Growth and Characterisation of InGaN/GaN Nanocolumn LED", Quantum Dots, Particles, and Nanoclusters III, 2006, pp. 1-8, Proc. of SPIE vol. 6129.

J. Wu et al., "Band Gaps of InN and Group III Nitride Alloys", Material Sciences Division, Lawrence Berkely National Laboratory, Superlattices and Microstructures, 2003, pp. 63-75, 2004 Elsevier Ltd.

* cited by examiner

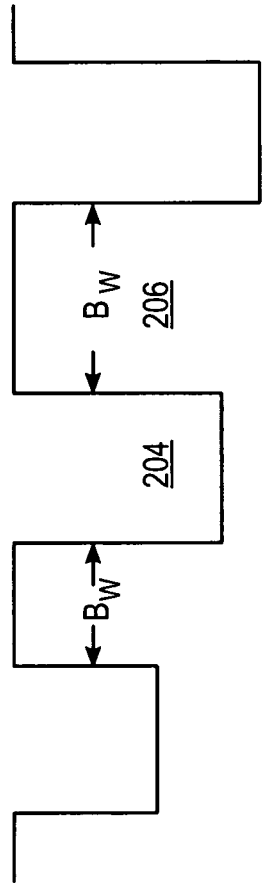
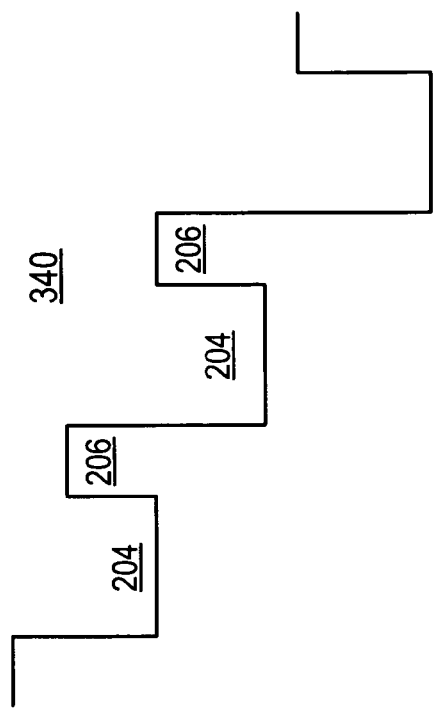
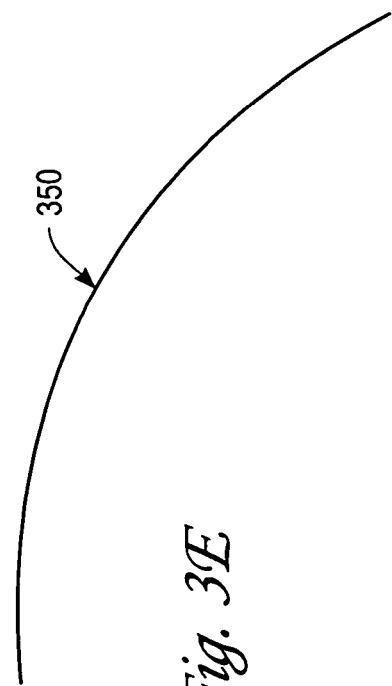

SOLAR CELL HAVING ACTIVE REGION WITH NANOSTRUCTURES HAVING ENERGY WELLS

FIELD OF THE INVENTION

The present invention relates to solar cell designs. In particular, embodiments of the present invention relate to an active region of a solar cell having energy wells.

BACKGROUND

Solar-cell technology is currently poised to make significant progress in mass adoption due in part to the looming shortage of traditional energy sources, e.g. crude oil and natural gas, and to the increased awareness of "green-technology" benefits. Solar-cell technology, though capturing "free" energy from the sun, has been expensive with per-watt ownership cost ($/W) far exceeding $/W offered by electric utilities. Recently at $5/W, the pay-off period for a solar panel is as much as 50% of its lifespan, due largely to the expense of the semiconductor material used. The persistently high $/W figure has led to ideas on cost reduction, an example of which is concentrated photovoltaics (CPV). In CPV, the sun's energy is concentrated hundreds of times onto a solar cell. CPV, however, requires the solar cell to be very thermally robust due to high heat resulting from the concentration. Fortunately, the advent of new materials with more robust thermal properties and band gap energies better suited to the sun's spectrum has made solar technology attractive again through CPV.

Until recently, silicon (Si) has been at the core of solar-cell technology. However, efficiency for the best single-junction-Si-based cells only reaches about 22%. Recently, multi-junction solar cell designs have achieved efficiencies that far surpass single junction devices. In the multi-junction design, typically, each junction is formed of a different material. For example, III-V compound semiconductors (e.g., InGaAs, InGaP) and group IV materials (e.g., Ge), have been used together to make multi-junction solar cells. These multi-junction solar cells typically use a different material for each junction. Laboratory efficiencies as high as 40.7% in a three junction design using the three mentioned semiconductors have been claimed.

However, these III-V compound-semiconductor-based solar cells are more expensive than single junction Si devices due to material cost as well as manufacturing complexity. Therefore, these devices have been excluded in the traditional solar-panel business where sheer size requirement meant prohibitive cost. Space and other niche applications have, however, sustained the specialized interests in the more expensive but more efficient and robust solar cells based on the III-V compound semiconductors.

Therefore, while improvements have been made in solar cell efficiency, still further improvements in efficiency are desirable. It is further desirable that the per-watt ownership cost of solar cells be reduced.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3A, FIG. 3B, FIG. 3C, FIG. 3D, and FIG. 3E are conduction energy band diagrams for different energy well configurations, in accordance with embodiments of the present invention.

DETAILED DESCRIPTION

Figure 1:
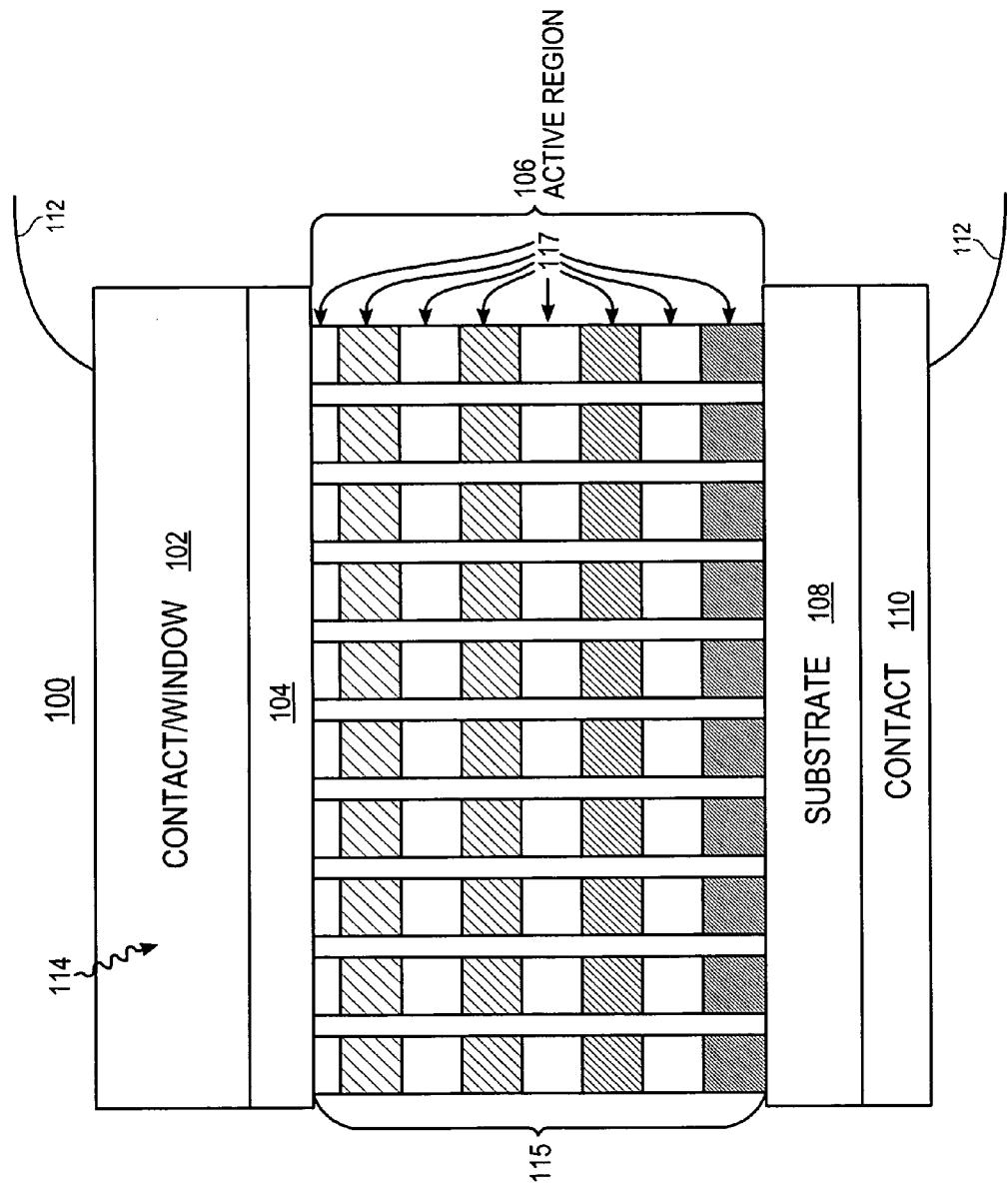
FIG. 1 is an example single junction solar cell, in accordance with an embodiment of the present invention.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

A photovoltaic cell ("solar cell") having a photo-active region ("active region") with energy wells is disclosed herein. The energy wells may be quantum wells, but that is not required. The energy wells may be graded, by which it is meant that the energy wells have a different band gap from one another, generally increasing or decreasing from one well to another monotonically. The solar cell admits electromagnetic radiation through what will be referred to as a "window" of the solar cell. In general, the energy wells that are further away from the window have a lower band gap than energy wells nearer to the window.

The active region comprises nanostructures, in one embodiment. The nanostructures may be nanocolumns, nanowires, nanorods, nanotubes, etc. The nanostructures are formed from a material that comprises a III-V compound semiconductor and an element that alters the band gap of the III-V compound semiconductor. For example, the III-V compound semiconductor could be gallium nitride (GaN), which has a band gap that is about 3.4 eV. As an example, the "band gap altering element" could be indium (In). When In is incorporated into GaN, and replaces the Ga, the band gap of the resulting InGaN is lower than the band gap of GaN. The more In that is incorporated (and therefore the more Ga that is replaced), the lower the band gap of InGaN. If all of the Ga is replaced by In, resulting in InN, the band gap is about 0.7 eV. A significant amount of In can be incorporated into nanostructures of InGaN, with the nanostructures being substantially free of defects and strain.

In one embodiment, the concentration of the indium in the active region is non-uniform such that the active region has a number of energy wells, separated by barriers. The energy wells are capable of "absorbing" photons. As previously mentioned, the energy wells are "graded", by which it is meant that band gap of each energy well progressively decreases moving away from the window. Thus, the energy wells that are closer to the window absorb photons that have energy that is at least as high as the band gap, but do not absorb photons having less energy. However, energy wells that are further from the window are able to absorb photons having less energy.

Note that photons with a wavelength of about 365 nanometers (nm) have an energy of about 3.4 eV. Therefore, photons having a wavelength of 365 nm or shorter may be absorbed by a material having a band gap of 3.4 eV (e.g., GaN). Note that photons with a wavelength of about 1700 nanometers (nm) have an energy of about 0.7 eV. Therefore, photons of 1700 nm or shorter may be absorbed by a material having a band gap of 0.7 eV (e.g., InN). Further note that by having the In concentration increase from the window to the back of the solar cell, photons with increasingly less energy (longer wavelength) may be absorbed further from the window.

A barrier between two energy wells has a higher band gap than those two energy wells, and will therefore not absorb photons whose energies are less than the barrier band gap. In other words, a photon must have a very short wavelength to be absorbed by a barrier. The barriers may serve to impede charge carriers from migrating between energy wells. However, charge carriers that are sufficiently energetic can "escape" the energy wells and be swept away as drift current (this drift current serves as the solar cell "output").

Example Solar Cell

FIG. 1 is an example single junction solar cell 100, in accordance with an embodiment of the present invention. The example solar cell 100 in general comprises a top contact/window 102, a top junction layer 104, an active region 106, a substrate 108 (which may serve also as a bottom junction layer), a bottom contact 110, and electrical leads 112.

The top contact/window 102 is transparent to electromagnetic radiation in at least a portion of the spectrum. Solar radiation (e.g., photons) 114 enters through the top contact/window 102 and may be absorbed in the active region 106. Absorption of a photon promotes an electron to the conduction band. Electrons promoted to a conduction band by the absorption of photons may conduct to the contacts 102, 110. Note that behavior of holes will not be discussed. The lower contact 110 may be made of a suitable metal, and does not need to be transparent. The lower contact 110 may be optimized for high reflectivity for all solar cell devices containing the layer 110. The electrons conduct through the electrical leads 112.

The active region 106 is formed from a number of nanostructures 115 laterally distributed in the solar cell 100. The active region 106 is designed such that higher energy photons are absorbed near the window 102 and lower energy photons are absorbed near the substrate 108. This is accomplished by varying the concentration of a band gap altering element in the nanostructures 115. In particular, each segment 117 of a nanostructure 115 has a particular concentration of the band gap altering element to achieve a desired band gap for that segment 117. The active region 106 is more fully described below.

In one embodiment, the nanostructures 115 are formed of InGaN. The solar cell 100 may be an n-on-p device or a p-on-n device. In an n-on-p embodiment, the InGaN material is grown on a p-type substrate 108. In another embodiment, the solar cell 100 is a p-on-n single junction device with InGaN material grown on an n-type substrate 108. Examples of suitable materials for the substrate 108 include, but are not limited to, Si, germanium (Ge), silicon carbide (SiC), and zinc oxide (ZnO). If the substrate 108 is either Si, or Ge, the substrate 108 may be (111) plane oriented. If the substrate 108 is SiC, or ZnO, the substrate 108 may be (0001) plane oriented. The substrate 108 is doped with a p-type dopant, in one embodiment. An example of a p-type dopant for Si substrates includes, but is not limited to, boron (B). The p-type doping may be p, $p^+$ or, $p^{++}$. The substrate 108 is doped with an n-type dopant, in one embodiment. Examples of n-type dopants for Si substrates include, but are not limited to, arsenic (As) and phosphorous (P). The n-type doping may be n, $n^+$ or, $n^{++}$.

The active region 106 may be doped, resulting in either a p-n device or an n-p device. In such devices, a diode junction may appear near the window 102, close to the interface between top junction layer 104 and active region 106. However, the active region 106 does not need to be doped, resulting in either a p-i-n device or an n-i-p device. For example, in a p-i-n device, the electric field of the diode may appear across the active region 106. Further, the amount of doping in the active region 106 can be non-uniform. For example, some segments 117 may be heavily doped, other segments 117 may be lightly doped, still others may be undoped.

The nanostructures 115 may be grown either by self-assembly or by patterned growth using epitaxial growth techniques such as metalorganic chemical vapor deposition, molecular beam epitaxy and hydride vapor phase epitaxy. In patterned growth, a portion of the substrate surface which is not covered by mask material such as $SiO_2$ or $SiN_x$ is exposed to serve as nucleation sites for the nanostructures. The concentration of the indium in the nanostructures 115 is adjusted during the growth of the nanostructures 115 such that different segments 117 have different indium concentrations. A factor affecting the indium incorporation is amount of indium supply during active-region growth. Another factor affecting the indium incorporation is temperature, which affects the evaporation rate of indium on the growth surface during growth. Other factors may also affect the amount of indium that is incorporated into the nanostructures 115. When grown on an n-type substrate 108, the segment 117 of a nanostructure 115 that is adjacent to the substrate 108 may have any amount of indium concentration.

The lateral width of the nanostructures 115 may range from about 5 nm-500 nm. The entire range of widths may be present in a single active region 106. The width of at least some of the nanostructures 115 is sufficiently wide such that there is no quantum confinement effect in the lateral direction, in one embodiment. However, the width of at least some of the nanostructures 115 is sufficiently narrow to cause quantum confinement in the lateral direction, in one embodiment. The lateral width of a nanostructure 115 may be less than 5 nm and may be greater than 500 nm. The relatively narrow width may result in the nanostructures 115 being strain relaxed. Strain relaxed nanostructures 115 may allow for a high concentration of indium to be incorporated therein.

The segments 117 may have any length. Further, segments 117 in a particular nanostructure 115 may have different lengths from each other. In one embodiment, the indium concentration is approximately uniform in a particular segment 117. In one embodiment, the indium concentration changes continuously along the growth axis of the nanostructures 115. Thus, the nanostructures 115 do not have segments 117, in one embodiment.

Top junction layer 104 may be formed from the same compound semiconductor as the nanostructures 115. For example, junction layer 104 may be formed from InGaN. In junction layer 104, the formula for the InGaN is $In_yGa_{y-1}N$, where y may be any value between 0 and 1. Top junction layer 104 may comprise more than one sublayer, with the sublayers having different concentrations of indium.

The junction layer 104 is depicted as being coalesced in the example solar cell 100. However, junction layer 104 may be uncoalesced. That is, distinct nanostructures 115 may extend into all, or a portion of, junction layer 104. In the embodiment in which the solar cell 100 is an n-on-p device, junction layer 104 is n-doped. The n-type doping may be n, $n^+$, or $n^{++}$. In the embodiment in which the solar cell 100 is a p-on-n device, junction layer 104 is p-doped. The p-type doping may be p, $p^+$ or, $p^{++}$.

If junction layer 104 is coalesced, then the top contact/window 102 may be directly deposited to junction layer 104. As examples, a metal grid, an indium-tin-oxide (ITO) grid, or an ITO sheet may be directly deposited onto coalesced junction layer 104. If junction layer 104 is uncoalesced, then a transparent substrate can be bonded to the uncoalesced junction layer 104 with a grid or a full sheet ITO, or a metal grid deposited onto the transparent substrate.

The example solar cell 100 is compatible with solar concentration systems, which focus electromagnetic radiation many times onto the solar cell 100.

Active Region

The active region 106 may comprise segments 117, each having a particular concentration of a "band gap altering element." As used herein, the term "band gap altering element" as any element whose concentration affects the band gap of the material into which it is incorporated. As an example, indium is a band gap altering element when incorporated into at least some III-V compound semiconductors. As a particular example, the concentration of indium in GaN affects the band gap of InGaN. The indium replaces the gallium when it is incorporated into GaN. Thus, the formula for segments 117 may be $In_xGa_{x-1}N$. Indium may also affect the band gap of other III-V compound semiconductors. In general, In may lower the band gap of a III-V compound semiconductor. Other band gap altering elements may increase the band gap. For example, the incorporation of aluminum (Al) increases the band gap of GaN. That is, the higher the concentration of Al in AlGaN, the higher will be the band gap of AlGaN.

Figure 2:
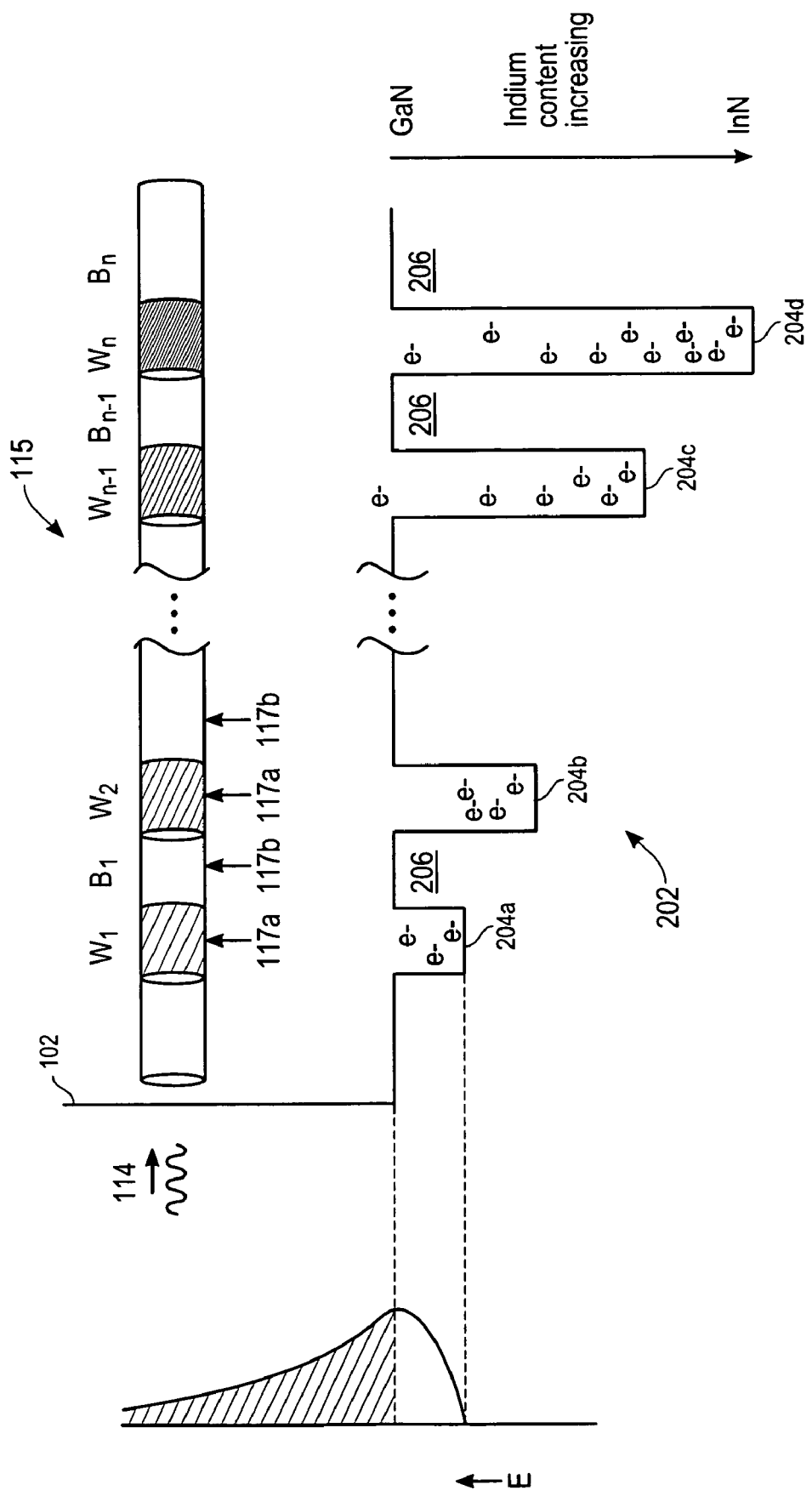
FIG. 2 depicts a physical structure of a single nanostructure and a corresponding conduction energy band diagram, in accordance with an embodiment of the present invention.

For purposes of illustration, the following discussion will use In as an example band gap altering element. However, an element other than In might be used. The different concentration of In results in a number of energy wells with barriers between the energy wells, in one embodiment. FIG. 2 depicts a physical structure of a single nanostructure 115 that is divided into segments 117a, 117b and a conduction energy band diagram 202 showing energy wells 204 and barriers 206 corresponding to the segments 117 in the nanostructure 115. The energy wells 204 may be quantum wells, but that is not a requirement. The nanostructure 115 has a number of well segments 117a and a number of barrier segments 117b. Well segments are also referenced as $W_1$-$W_n$. A well segment 117a is defined as a segment 117 that results in an energy well 204. A barrier segment 117b is defined as a segment 117 that results in an energy barrier 206. Well segment $W_1$ is closest to the window 102 of the solar cell where solar radiation is admitted. Comparing the well segments 117a with each other, the indium concentration is higher in the well segments 117a that are further away from the window 102 of the solar cell.

Referring to the band gap diagram 202, higher indium concentration corresponds to a lower band gap in the InGaN. Therefore, the energy wells 204 further from the window 102 have a lower band gap than energy wells 204 near the window 102. The term "graded energy wells" is used herein to describe a configuration of, in general, decreasing band gaps of well segments 117a in the direction away from the window 102 of the solar cell.

In this example, the barrier segments 117b have approximately the same indium concentration as each other. Therefore, the "height" of the energy barriers 206 that corresponds to the barrier segments 117b are approximately the same as each other, as depicted in the energy band diagram 202. This results in an approximately level band gap from the window 102 to the substrate 108 of the solar cell for barrier segments 117b. However, this level band gap for barrier segments 117b is not required. In one embodiment, the band gap of the barrier segments 117b is graded such that the band gap, in general, decreases from barrier segments 117b nearer to the window 102 to those further from the window 102.

Note that for convenience of illustration, the bottom of a particular energy well 204 is depicted as being substantially flat. In other words, as having substantially uniform band gap. However, effects such as a piezoelectric effect may cause a slope at the bottom of energy wells 204. Further, the band gap for barrier segments 117b may also have a slope even though the concentration of indium is uniform throughout a particular barrier segment 117b.

Selection of Electrons for Extraction as Current

Because of the configuration of energy wells 204 and energy barriers 206, not all of the electrons that are promoted by a photon to the conduction band (or above the conduction band) are able to escape the energy well 204. The electrons that are promoted to (at least) the conduction band will have a distribution of energy. Some of the electrons will be energetic enough to pass through the barrier segments 117b. FIG. 2 shows a thermal energy distribution (E) for electrons in one of the energy wells 204a. Electrons having at least as much energy as the conduction band of the barriers 206 can "escape" the energy well 204a and migrate out of the active region 106. Note that due to thermal equilibrium the shape of the thermal distribution (E) may tend to remain the same despite the more energetic photons exiting the energy well 204a. Electrons with sufficient thermal energy in the other energy wells 204b-d will also migrate out of the active region 106. The electrons that exit the energy wells 204a-d migrate towards the window 102 in an "n-on-p" embodiment due to the electric field generated by the n-p junction. The electrons migrate away from the window 102 in a "p-on-n" embodiment due to the electric field generated by the p-n junction. The elevated temperature of solar cell during CPV operation may benefit the operation as thermal energy will increase the number of electrons able to escape wells and be swept away as drift current.

Note that because only electrons having at least the barrier energy 206 of the barrier segments 117b are able to cross a barrier segment 117b, these "energetic" electrons are not likely to fall into an energy well 204 as they migrate out of the active region 106 unless energy losses occur due to inelastic scatterings by the semiconductor's scattering centers. Moreover, the band gap of the barrier segments 117b may be used as parameter for determining output voltage.

Alternative Energy Well and Barrier Configurations

Figure 3A:
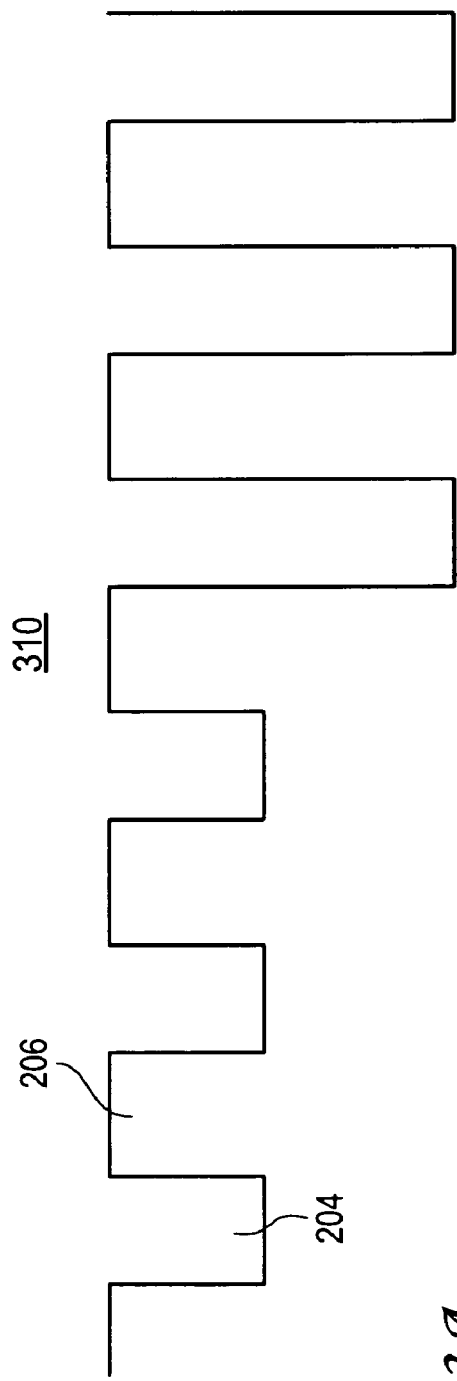

It is not required that each of the energy wells 204 have a different band gap from each other. In one embodiment, the energy wells 204 are grouped, as depicted in the conduction energy band diagram 310 of FIG. 3A.

Figure 3B:
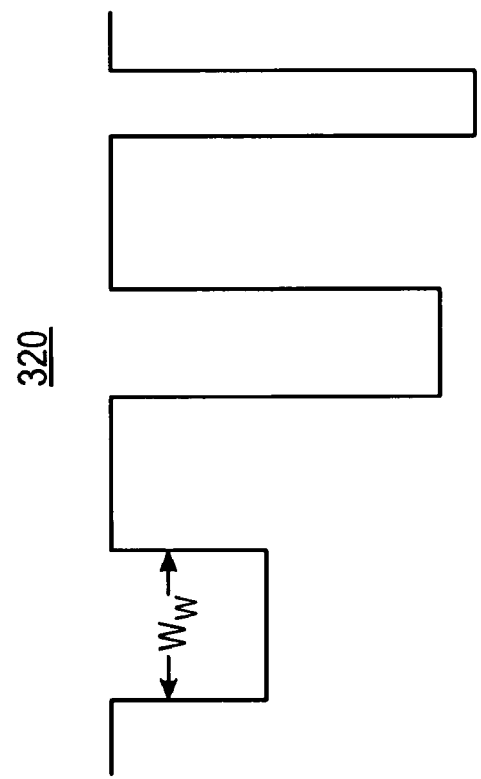

The width ($W_w$) of each energy well 204 may be individually configured to fine tune the band gap using quantum confinement effect, as depicted in the conduction energy band diagram 320 of FIG. 3B. The well width $W_w$ may be configured by controlling the length of well segments 117a during nanostructure formation.

The width ($B_w$) of each barrier 206 may be individually configured to control tunneling between energy wells 204, as depicted in the conduction energy band diagram 330 of FIG. 3C. The barrier width $B_w$ may be configured by controlling the length of barrier segments 117b during nanostructure 115 growth.

Furthermore, the well width may be configured to influence (e.g., reduce) electron-hole recombination rate by affecting piezoelectric field effect due to polarization charges at well-barrier interfaces.

Energy wells 204 and barriers 206 may individually be doped appropriately (undoped, n-type, p-type) to also affect (e.g., reduce) electron-hole recombination rate by affecting the piezoelectric field due to polarization charges at well-barrier interfaces.

In one embodiment, the barriers 206 are graded, as depicted in the conduction energy band diagram 340 of FIG. 3D. Barriers 206 can be graded by appropriate selection of the concentration of the band gap altering element during nanostructure 115 growth.

In one embodiment, the concentration of the band gap altering element changes continuously throughout all, or a portion of, the active region 106. Thus, there are no energy wells 204 and barriers 206 despite the change in concentration of the band gap altering element. FIG. 3E depicts a conduction energy band diagram 350 for an embodiment in which the band gap changes continuously in at least a portion of the active region 106 due to a continuous change in concentration of the band gap altering element.

Example Multi-Junction Device Using Tunnel Junctions

Figure 4:
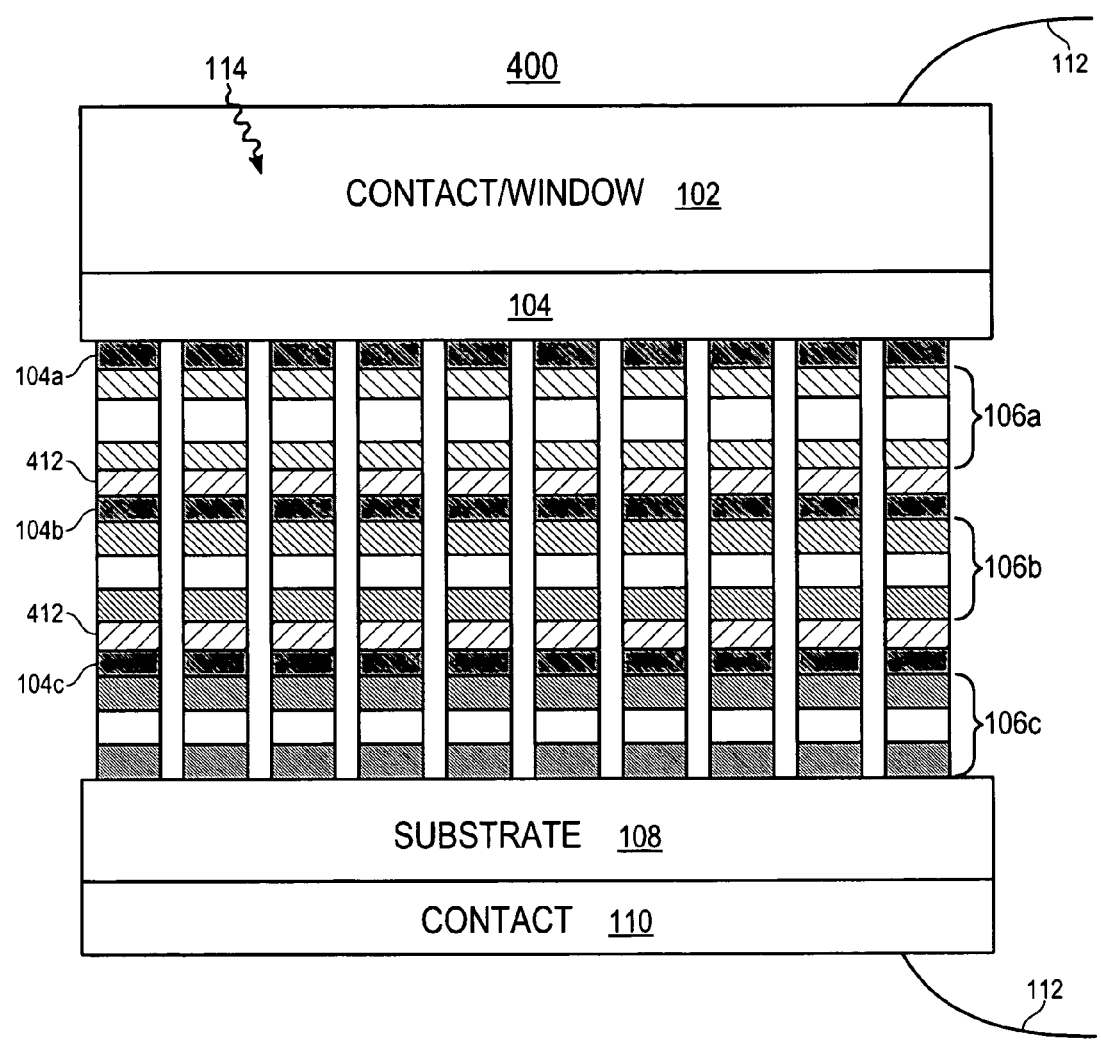
FIG. 4 illustrates an example three junction solar cell, in accordance with an embodiment of the present invention.

In one embodiment, the solar cell device has one or more tunnel junctions. FIG. 4 illustrates on example three junction device 400, in accordance with an embodiment of the present invention. In general, the device 400 has top contact/window 102, top junction layers 104a-c, active regions 106a-c, tunnel junctions 412, substrate 108, bottom contact 110, and electrical leads 112.

The three active regions 106a-c are separated by tunnel junctions 412. Further, each active region 106a-c is paired with a top junction layer 104a-c to form a junction. Each of the three active regions 106a-c may be configured for absorption of photons of different ranges of wavelengths. For example, the different segments 117 in active region 106a may be configured to absorb photons from 365 nm to R nm. In active region 106b, the segments 117 may be configured to absorb photons from R nm to S nm. In active region 106c, the segments 117 may be configured to absorb photons from S nm to 1700 nm. As previously discussed, the concentration of a band gap altering element (e.g., indium) is selected to achieve the desired wavelength absorption. Further, a band gap energy corresponds to a "characteristic wavelength", which is equal to the longest wavelength of a photon that can be absorbed. Because the segments 117 nearest the window 102 have the highest band gaps, their characteristic wavelengths are the shortest and thus, "transmit" or "pass" those photons with longer wavelengths. In this manner, the segments 117 nearest the window 102 act as "long-pass filters" for the segments 117 further away from the window 102, and wavelengths of absorbed photons progressively become longer, further away from window 102.

In any of the active regions 106a, 106b, 106c some segments 117 may act as energy wells 204 with others acting as energy barriers 206 with higher band gap than adjacent segments 117. The energy wells 204 may be graded. However, in one embodiment, at least a portion of the active region 106 has a continuous change in the band gap as depicted in FIG. 3E. Series connection of the three junctions is achieved by two tunnel junctions 412 separating the three junctions. The tunnel junctions 412 are grown in the device 400, in the embodiment depicted in FIG. 4, so the device 400 is monolithic. As an alternative to device 400 more or fewer active regions 106 and tunnel junctions 412 may be used.

The device 400 may be an n-on-p device or a p-on-n device. The active regions 106 may comprise InGaN, although other materials might be used. The discussion of the top contact 102, substrate 108, and bottom contact 110 of example solar cell 100 in FIG. 1 applies to example device 400. The top junction layers 104a-c are similar to those in example solar cell 100. However, only the top junction layer 104a near the top contact/window 102 may be coalesced. Top junction layers 104b, 104c are not coalesced.

Example Multi-Junction Solar Cell

Figure 5:
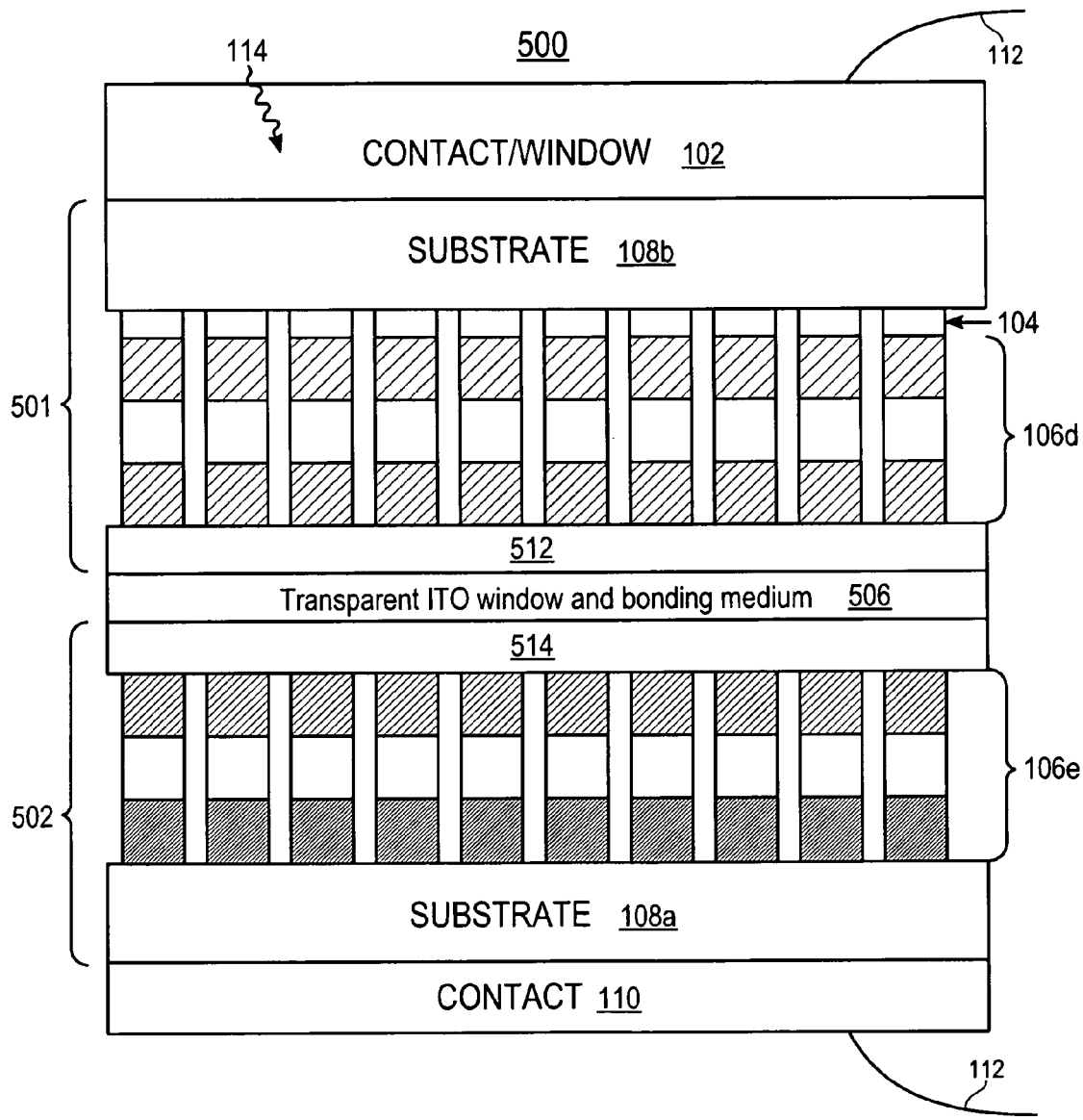
FIG. 5 illustrates an example two junction solar cell, in accordance with an embodiment of the present invention.

FIG. 5 illustrates an example two-junction solar cell 500, in accordance with an embodiment of the present invention. The solar cell 500 may be fabricated by separately growing two devices and bonding them together. In FIG. 5, the two devices are upper device 501 and lower device 502. Upper device 501 may be formed by growing nanostructures of InGaN material on substrate 108b. For purposes of illustration solar cell 500 will be discussed with respect to a particular n- and p-type doping. However, variations of the doping are possible. Further, InGaN is used for illustration, but other materials may be used.

Substrate 108b is transparent to electromagnetic radiation in a region of interest and may be an n-type SiC or ZnO substrate. The region of interest may be the visible and infrared wavelengths, but could extend outside of these wavelengths.

The InGaN material in device 501 has three regions. Closest to the substrate 108b is an uncoalesced top junction layer 104, which may have any indium concentration. The doping may be n, $n^+$ or, $n^{++}$. The active region 106d may be undoped or have p-type doping. The segments 117 have different indium concentration from each other such that the target absorption spectrum ranges from about 365 nm to R nm. The device 501 has a lower junction layer 512. The lower junction layer 512 may be coalesced or uncoalesced. The doping of the lower junction layer may be p, $p^+$ or, $p^{++}$.

The lower device 502 may be formed by growing nanostructures 115 of InGaN material on substrate 108a. Substrate 108a does not need to be transparent and may be p-type Si, Ge, SiC, or ZnO. The InGaN material in device 502 has two regions. Closest to the substrate 108a is the active region 106e, which may be undoped or have p-type doping. The segments 117 have different indium concentration from each other such that the target absorption spectrum ranges from about R nm to 1700 nm. The device 502 has a junction layer 514, which completes the n-p junction. The junction layer 514 is coalesced, in the embodiment depicted in FIG. 5. Thus, the junction layer 514 may be formed by growing nanostructures that coalesce in junction layer 514. The doping may be n, $n^+$ or, $n^{++}$.

The upper device 501 may be bonded to the lower device 502 by using a transparent ITO 506 as the bonding material between the devices 501 and 502. The two diode junctions are therefore connected in series. The electricity generated conducts vertically to contact 110, which are made of suitable metals.

As an alternative to the design of example two device solar cell 500, three or more devices can be used. An additional transparent ITO is used to bond the additional device to one of the others. With three devices, the target absorption spectrum ranges can be divided into three regions.

In either of the active regions 106d, 106e, some segments 117 may act as energy wells 204 with others acting as energy barriers 206 with higher band gap than adjacent segments 117. The energy wells 204 may be graded. However, in one embodiment, at least a portion of the active region 106 has a continuous change in the band gap as depicted in FIG. 3E.

Etched Away Substrate

Figure 6:
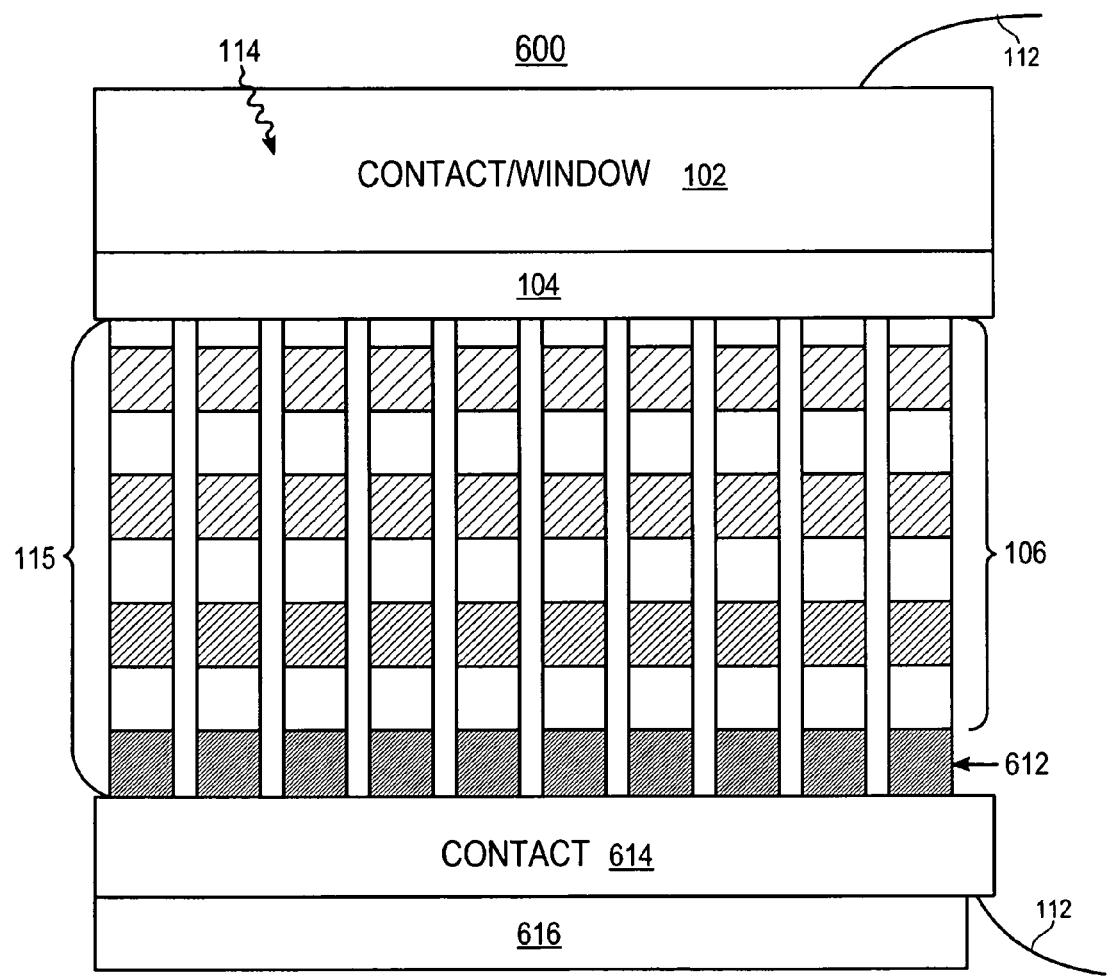
FIG. 6 illustrates an example solar cell in which the growth substrate has been etched away, in accordance with an embodiment of the present invention.

In one embodiment, the substrate on which the nanostructures 115 were grown is etched away. FIG. 6 illustrates an example solar cell 600 in which the growth substrate has been etched away, in accordance with an embodiment. In general, the example solar cell 600 has a top contact/window 102, a top junction layer 104, an active region 106 formed of nanostructures 115, a lower junction layer 612, a lower contact 614, a base substrate 616, and electrical leads 112.

The active region 106 and lower junction layer 612 are nanostructures 115 that are grown on a substrate that has been etched away. As an example, the nanostructures 115 may comprise InGaN material. However, a different band gap altering element and a different III-V compound semiconductor may be used.

After the substrate is etched away, the lower contact 614 and base substrate 616 are bonded to the nanostructures 115. The lower contact 614 may be sheet metal for good electrical conduction to the lead 112. The base substrate 616 should have good heat conductivity and provides mechanical support. In addition, the base substrate 616 may be optimized for high reflectivity.

In one embodiment, the example solar cell 600 is a p-on-n device. Thus, the lower junction 612 may be n-doped, the top junction layer 104 may be p-doped, and the active region 106 may be n-doped. However, it is not required that the active region 106 be doped. Moreover, etching away the substrate may be used with n-on-p, n-i-p, and p-i-n devices. Further, etching away of the growth substrate is not limited to single junction devices.

In active region 106 of example solar cell 600, some segments 117 may act as energy wells 204 with others acting as energy barriers 206 with higher band gap than adjacent segments 117. The energy wells 204 may be graded. However, in one embodiment, at least a portion of the active region 106 has a continuous change in the band gap as depicted in FIG. 3E.

Reflective Substrate

In one embodiment, the substrate 108 is made reflective such that photons that are not absorbed in the active region 106 are reflected back to the active region. For example, referring again to FIG. 1, the substrate 108 (e.g., Si) used for nanostructure 115 growth may be etched to generate porous Si that diffusely reflects unabsorbed photons back towards the active region 106. Because making the substrate 108 porous may reduce vertical conductivity, the substrate 108 may be made partially porous. In one embodiment, the substrate 108 is an n-type Si substrate. However, the substrate 108 is not limited to Si, or to n-type doping. Making the substrate 108 reflective is not limited to single junction devices.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A solar cell comprising:
    an active region, wherein the active region comprises a plurality of nanostructures each having a bottom and a top, said nanostructures formed of:
        a III-V compound semiconductor that is present substantially from the bottom to the top of substantially all of the plurality of nanostructures; and
        a band gap altering element incorporated into the III-V compound semiconductor;
        wherein concentration of the band gap altering element is non-uniform to create a plurality of segments in substantially all of the nanostructures, wherein each of the segments has a band gap;
    wherein the band gap of a particular segment is established at least in part by concentration of the band gap altering element; and
    wherein concentration of the band gap altering element is non-uniform throughout the nanostructures to create energy wells of different energy levels and barriers between the energy wells.

2. The solar cell of claim 1, wherein the solar cell has a window that admits electromagnetic radiation and wherein energy wells closer to the window have higher band gaps than energy wells further from the window.

3. The solar cell of claim 1, wherein the solar cell has a window that admits electromagnetic radiation and wherein band gap of energy wells decreases monotonically from one energy well to another in a direction away from the window.

4. The solar cell of claim 1, wherein the barriers between the energy wells have approximately the same band gaps as each other.

5. The solar cell of claim 1, wherein the barriers between the energy wells have graded band gaps.

6. The solar cell of claim 1, wherein the solar cell has a window that admits electromagnetic radiation, and wherein the barriers between the energy wells that are closer to the window have greater band gaps than the barriers that are further from the window.

7. The solar cell of claim 1, wherein the barriers between the energy wells impede charge carriers from migrating between the energy wells.

8. The solar cell of claim 1, wherein a first and second of the segments corresponds to a first and a second energy well, the first and second segments have different lengths to fine tune the band gap of the first and second energy wells by quantum confinement effect.

9. The solar cell of claim 1, wherein width of a particular barrier between two of the energy wells is configured to control charge carrier tunneling between the two energy wells.

10. The solar cell of claim 1, wherein width of a particular energy well is configured to influence electron-hole recombination rate by affecting piezoelectric field effect due to polarization charges at well-barrier interfaces.

11. The solar cell of claim 1, wherein a particular energy well is doped to influence electron-hole recombination rate by affecting piezoelectric field effect due to polarization charges at an interface between the particular energy well and an adjacent barrier.

12. The solar cell of claim 11, wherein a particular energy barrier adjacent to the particular energy well is doped to influence the electron-hole recombination rate by affecting piezoelectric field effect due to polarization charges at the interface.

13. The solar cell of claim 1, wherein a particular energy barrier adjacent to a particular energy well is doped to influence electron-hole recombination rate by affecting piezoelectric field effect due to polarization charges at an interface between the particular energy barrier and the particular energy well.

14. The solar cell of claim 1, wherein the band gap altering element comprises indium.

15. The solar cell of claim 1, wherein the band gap altering element comprises aluminum.

16. The solar cell of claim 1, wherein the band gap altering element creates the energy wells by lowering a band gap of portions of the nanostructures.

17. The solar cell of claim 1, wherein the band gap altering element increases a band gap of the barriers between the energy wells.

18. The solar cell of claim 1, wherein the III-V compound semiconductor comprises gallium nitride.

19. The solar cell of claim 1 comprising a plurality of active regions as described in claim 1.

20. The solar cell of claim 1, further comprising a layer that is configured to reflect photons that were not absorbed when passing through the active region back into the active region.

21. The solar cell of claim 1, wherein the barriers have a bandgap that is selected to control output voltage of the solar cell.

22. A solar cell comprising:
a substrate having a conductivity of a first type;
a plurality of nanostructures formed substantially throughout from $In_xGa_{x-1}N$, wherein the concentration of indium varies to create a plurality of segments in substantially all of the nanostructures, wherein each of the segments has a band gap that is established at least in part by the concentration of the indium; and
a top junction layer over the plurality of nanostructures, the top junction layer has a conductivity of a second type that is opposite the first type of conductivity;
wherein the concentration of the indium is non-uniform in the plurality of nanostructures to create energy wells of different energy levels and barriers between the energy wells.

23. The solar cell of claim 22, wherein the plurality of nanostructures are doped substantially throughout with a material having the first type of conductivity.

24. The solar cell of claim 22, wherein the plurality of nanostructures are intrinsic, the solar cell is either a p-i-n structure or an n-i-p structure.

25. The solar cell of claim 22, wherein the solar cell further includes a window that admits electromagnetic radiation, wherein band gap of the energy wells decreases monotonically from one energy well to the next energy well in a direction away from the window.

26. The solar cell of claim 25, wherein the barriers between the energy wells have approximately the same band gaps as each other.

27. The solar cell of claim 22, wherein width of a particular barrier between two of the energy wells is configured to control charge carrier tunneling between the two energy wells.

28. A solar cell comprising:
a substrate having a conductivity of a first type;
a plurality of nanostructures each having a bottom and a top, the nanostructures including a III-V compound semiconductor from the bottoms to the tops of the nanostructures and a band gap altering element incorporated into the III-V compound semiconductor, the band gap altering element has a concentration of zero or more, the concentration of the band gap altering element varies to create a plurality of segments in substantially all of the nanostructures, wherein each of the segments has a band gap that is established at least in part by the concentration of the band gap altering element; and
a top junction layer over the plurality of nanostructures, the top junction layer has a conductivity of a second type that is opposite the first type of conductivity;
wherein the concentration of the band gap altering element is non-uniform in the plurality of nanostructures to create energy wells of different energy levels and barriers between the energy wells.

29. The solar cell of claim 28, wherein the plurality of nanostructures are doped substantially from the bottoms to the tops of the nanostructures with a material having the first type of conductivity.

30. The solar cell of claim 28, wherein the plurality of nanostructures are not doped.

31. The solar cell of claim 28, wherein a first and second of the segments correspond to a first and a second energy well, the first and second segments have different lengths to fine tune the band gap of the first and second energy wells by quantum confinement effect.

32. The solar cell of claim 28, wherein width of a particular energy well is configured to influence electron-hole recombination rate by affecting piezoelectric field effect due to polarization charges at well-barrier interfaces.

33. The solar cell of claim 28, wherein the energy wells, the barriers or both the energy wells and the barriers are doped to influence electron-hole recombination rate by affecting piezoelectric field effect due to polarization charges at an interface between energy wells and adjacent barriers.

* * * * *